(12) United States Patent
Kumagai et al.

(10) Patent No.: US 11,486,760 B2
(45) Date of Patent: Nov. 1, 2022

(54) RECEIVING CIRCUIT AND OPTICAL RECEIVING CIRCUIT

(71) Applicant: SUMITOMO ELECTRIC INDUSTRIES, LTD., Osaka (JP)

(72) Inventors: Seiji Kumagai, Osaka (JP); Yoshiyuki Sugimoto, Osaka (JP); Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/445,334

(22) Filed: Aug. 18, 2021

(65) Prior Publication Data

US 2022/0057262 A1 Feb. 24, 2022

(30) Foreign Application Priority Data

Aug. 24, 2020 (JP) .............................. JP2020-141161

(51) Int. Cl.
*G01J 1/44* (2006.01)
*H03F 1/56* (2006.01)

(52) U.S. Cl.
CPC .................. *G01J 1/44* (2013.01); *H03F 1/56* (2013.01); *G01J 2001/446* (2013.01)

(58) Field of Classification Search
CPC ......... G01J 1/44; G01J 2001/446; H03F 1/56; H03F 1/3211; H03F 3/45071; H03F 3/08
See application file for complete search history.

(56) References Cited

U.S. PATENT DOCUMENTS

| 9,866,184 | B1* | 1/2018 | Lee ...................... H03F 3/45085 |
| 10,211,865 | B1* | 2/2019 | Miller ..................... H03H 11/28 |
| 2020/0145114 | A1* | 5/2020 | Tatsumi ............. H04B 10/6911 |

FOREIGN PATENT DOCUMENTS

| JP | 2002-523952 | 7/2002 |
| WO | 00/11780 | 3/2000 |

* cited by examiner

*Primary Examiner* — Thanh Luu
*Assistant Examiner* — Monica T Taba
(74) *Attorney, Agent, or Firm* — IPUSA, PLLC

(57) ABSTRACT

A receiving circuit includes a first input terminal and a second input terminal, an input circuit that includes a first node, a second node, a first inductor, a second inductor, a first variable resistive element, and a second variable resistive element. The first variable resistive element is electrically connected between the first node and the second input terminal, and the second variable resistive element is electrically connected between the second node and the first input terminal. The receiving circuit further includes a differential amplifier configured to generate a differential voltage signal in accordance with a differential current signal. The receiving circuit still further includes a control circuit configured to perform detection of an amplitude of the differential voltage signal and change a resistance value of the first variable resistive element and a resistance value of the second variable resistive element based on a result of the detection.

8 Claims, 11 Drawing Sheets

RECEIVING CIRCUIT AND OPTICAL RECEIVING CIRCUIT

CROSS-REFERENCE TO RELATED APPLICATIONS

This application claims priority to Japanese Patent Application No. 2020-141161, filed on Aug. 24, 2020, the entire subject matter of which is incorporated herein by reference.

BACKGROUND

1. Field of the Invention

The present disclosure relates to a receiving circuit and an optical receiving circuit.

2. Description of the Related Art

In a differential amplifier that converts a differential current from a photodetector into a differential voltage, distortion of the differential voltage may be generated as the differential current increases. There is a technique that reduces the input current of the differential amplifier and suppresses distortion of the differential voltage by releasing the current through a field effect transistor (FET) provided in a differential input section when the differential voltage increases.

SUMMARY

According to one aspect of the embodiments of the present disclosure, a receiving circuit includes a first input terminal and a second input terminal, and an input circuit that includes a first node, a second node, a first inductor, a second inductor, a first variable resistive element, and a second variable resistive element. The first inductor is electrically connected between the first input terminal and the first node, the second inductor is electrically connected between the second input terminal and the second node, the first variable resistive element is electrically connected between the first node and the second input terminal, and the second variable resistive element is electrically connected between the second node and the first input terminal. The receiving circuit further includes a differential amplifier configured to generate a differential voltage signal in accordance with a differential current signal. The differential amplifier includes a first input node and a second input node. The first input node is electrically connected to the first node, the second input node is electrically connected to the second node, and the differential current signal is input to the first input node and the second input node. The receiving circuit still further includes a control circuit configured to perform detection of an amplitude of the differential voltage signal and change a resistance value of the first variable resistive element and a resistance value of the second variable resistive element based on a result of the detection.

According to another aspect of the embodiments of the present disclosure, with respect to a light receiving circuit for generating a differential voltage signal from a first optical signal and a second optical signal, the light receiving circuit includes a first light receiving element configured to generate a first current signal in accordance with the first optical signal, a second light receiving element configured to generate a second current signal in accordance with the second optical signal, a first input terminal electrically connected to the first light receiving element, a second input terminal electrically connected to the second light receiving element, and an input circuit that includes a first node, a second node, a first inductor, a second inductor, a first variable resistive element, and a second variable resistive element. The first inductor is electrically connected between the first input terminal and the first node, the second inductor is electrically connected between the second input terminal and the second node, the first variable resistive element is electrically connected between the first node and the second input terminal, and the second variable resistive element is electrically connected between the second node and the first input terminal. The light receiving circuit further includes a differential amplifier configured to generate a differential voltage signal in accordance with a differential current signal. The differential amplifier further includes a first input node and a second input node, the first input node is electrically connected to the first node, the second input node is electrically connected to the second node, and the differential current signal is input to the first input node and the second input node. The differential amplifier still further includes a control circuit configured to perform detection of an amplitude of the differential voltage signal and change a resistance value of the first variable resistive element and a resistance value of the second variable resistive element based on a result of the detection.

BRIEF DESCRIPTION OF THE DIAGRAMS

DETAILED DESCRIPTION

In the following, specific examples of the receiving circuit and the optical receiving circuit according to the embodiments of the present disclosure will be described with reference to the drawings. Here, the disclosure is not limited to these examples and is intended to be specified by the claims and to include all modifications within the meaning equivalent to the scope of the claims and within the scope of the claims.

[Detail of a First Embodiment of the Disclosure]

A specific example of a receiving circuit and an optical receiving circuit according to a first embodiment of the present disclosure will be described below with reference to the drawings.

Figure 4:
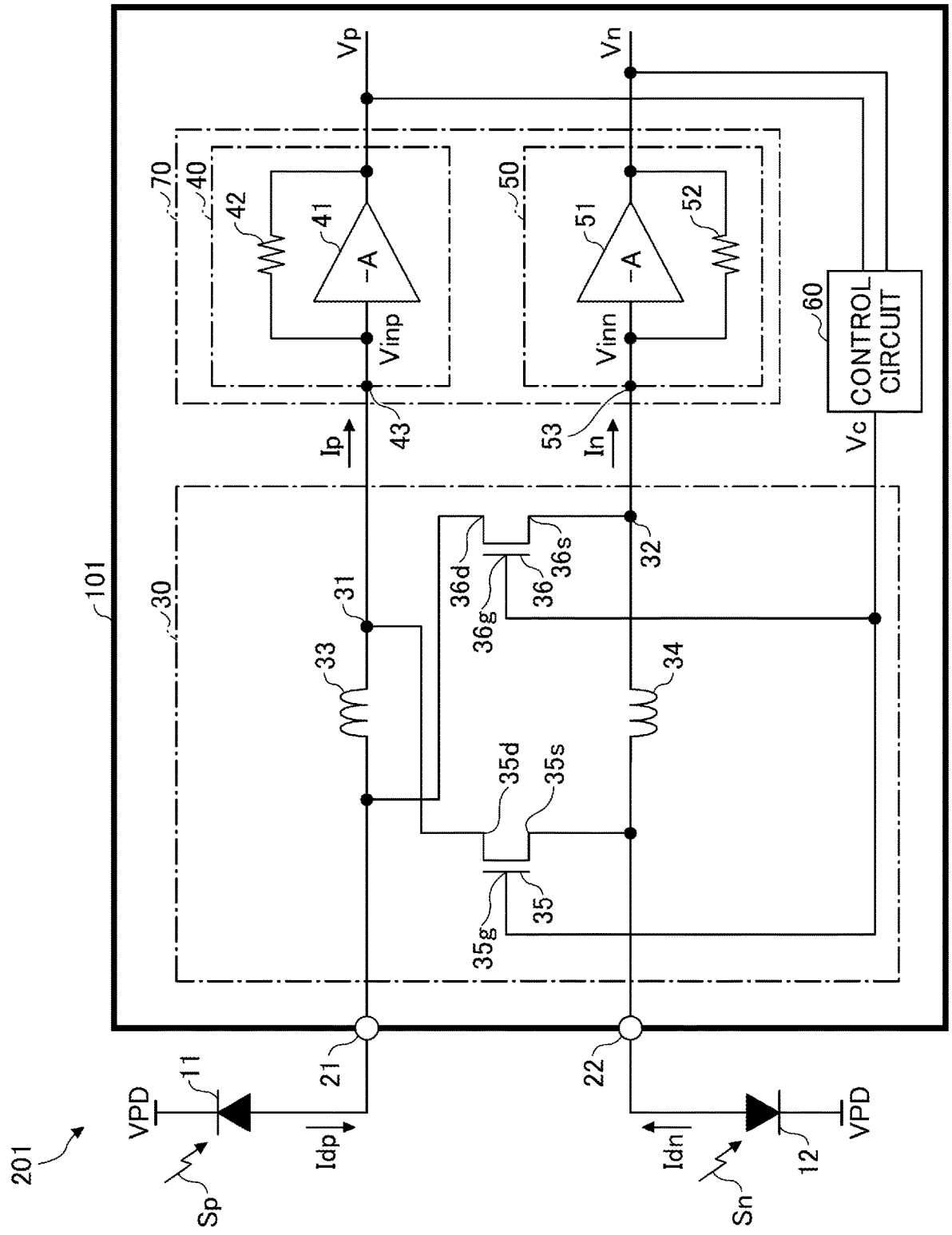
FIG. 4 is a diagram illustrating a configuration example of an optical receiving circuit according to a first embodiment.

FIG. 4 is a diagram illustrating a configuration example of the optical receiving circuit according to the first embodiment. The optical receiving circuit 201 illustrated in FIG. 4 generates a differential voltage signal (Vp, Vn) from a first optical signal Sp and a second optical signal Sn. A pair of the first optical signal Sp and the second optical signal Sn is, for example, a differential optical signal whose phases are reversed from each other. The first optical signal Sp is a positive phase component of the differential optical signal, and the second optical signal Sn is a reversed phase component of the differential optical signal. For example, when the signal intensity (i.e., the optical power) of the first optical signal Sp increases, the signal intensity of the second optical signal Sn decreases, and when the signal intensity of the first optical signal Sp decreases, the signal intensity of the second optical signal Sn increases. Additionally, when the signal intensity of the first optical signal Sp reaches a maximum value (i.e., a peak value), the signal intensity of the second optical signal Sn reaches a minimum value (i.e., a bottom value), and when the signal intensity of the first optical signal Sp reaches a bottom value, the signal intensity of the second optical signal Sn reaches a peak value. Preferably, the amplitude of the signal intensity of the second optical signal Sn is equal in magnitude to the amplitude of the signal intensity of the first optical signal Sp and a time average value of the signal intensity of the second optical signal Sn is equal to a time average value of the signal intensity of the first optical signal Sp. As described, the first optical signal Sp and the second optical signal Sn are a pair of complementary signals. In the following description, regardless of the optical signal or the electrical signal, in a differential signal, the positive and reversed phase components have the same characteristics as the first optical signal Sp and the second optical signal Sn described above. The optical receiving circuit 201 is mounted, for example, to a receiver of a digital coherent optical transmission system. The optical receiving circuit 201 includes a first light receiving element 11, a second light receiving element 12, and a receiving circuit 101. The first light receiving element 11 and the second light receiving element 12 are, for example, a pair of light receiving elements. For example, the second light receiving element 12 preferably has the same electrical and optical characteristics as the first light receiving element 11. For example, the first light receiving element 11 may be formed to have the same structure by using a material the same as the material of the second light receiving element 12.

The first light receiving element 11 receives the first optical signal Sp and generates a first current signal Idp (i.e., a first input current Idp). The first light receiving element 11 receives the first optical signal Sp and outputs the first current signal Idp having a greater current value as the signal intensity of the received first optical signal Sp increases. The first light receiving element 11 outputs the first current signal Idp having a smaller current value as the signal intensity of the received first optical signal Sp decreases. The first light receiving element 11 outputs the first current signal Idp in which the amplitude of the current changes in accordance with a change in the amplitude of the optical power of the first optical signal Sp. The first light receiving element 11 includes a cathode electrically connected to a positive terminal VPD of the power supply and an anode electrically connected to a first input terminal 21 of the receiving circuit 101. The first light receiving element 11 is, for example, a photodiode, but is not limited to this type. If the first light receiving element 11 is, for example, a photodiode, a bias voltage is applied to the cathode. For example, the positive terminal VPD of the power supply supplies the bias voltage to the first light receiving element 11. Although not illustrated, a negative terminal of the power supply that is paired with the positive terminal VPD is, for example, connected to a ground potential. For example, if the first light receiving element 11 is a photodiode, the first light receiving element 11 is used in a reverse bias condition so that the voltage of the anode is lower than the voltage of the cathode.

The second light receiving element 12 receives the second optical signal Sn and generates a second current signal Idn (i.e., a second input current Idn). The second light receiving element 12 receives the second optical signal Sn and outputs the second current signal Idn having a greater current value as the signal intensity of the received second optical signal Sn increases. The second light receiving element 12 outputs the second current signal Idn having a smaller current value as the signal intensity of the received second optical signal Sn decreases. The second light receiving element 12 outputs the second current signal Idn in which the amplitude of the current changes in accordance with a change in the amplitude of the light power of the second optical signal Sn. The second light receiving element 12 includes a cathode electrically connected to a positive terminal VPD of the power supply and an anode electrically connected to a second input terminal 22 of the receiving circuit 101. The second light receiving element 12 is, for example, a photodiode, but is not limited to this type. If the second light receiving element 12, is, for example, a photodiode, a bias current is applied to the cathode. For example, the positive terminal VPD of the power supply supplies the bias voltage to the second light receiving element 12. Although not illustrated, a negative terminal of the power supply that is paired with the positive terminal VPD is, for example, connected to a ground potential. If the second light receiving element 12 is, for example, a photodiode, the second light receiving element 12 is used in a reverse bias condition so that the voltage of the anode is lower than the voltage of the cathode. Here, the power supply that supplies the bias voltage to the first light receiving element and the power supply that supplies the bias voltage to the second light receiving element may be common or separate.

The receiving circuit 101 generates the differential voltage signal (Vp, Vn) in response to the first current signal Idp and the second current signal Idn. A first voltage signal Vp (i.e., a positive phase output voltage Vp) and a second voltage signal Vn (i.e., a reversed phase output voltage Vn) constitute the differential voltage signal (Vp, Vn). The first voltage signal Vp is a positive phase component of the differential voltage signal (Vp, Vn), and the second voltage signal Vn is a reversed phase component of the differential voltage signal (Vp, Vn). For example, if the first optical signal Sp and the second optical signal Sn are a pair of complementary signals, and phases of the first optical signal Sp and the second optical signal Sn are reversed with each other, a pair of the first current signal Idp and the second current signal Idn is a differential current signal whose phases are reversed with each other, the first current signal Idp is a positive phase component of the differential current signal, and the second current signal Idn is a reversed phase component of the differential current signal. The first current signal Idp and the second current signal Idn constitute a differential input current (Idp, Idn). For example, when the first input current Idp increases, the second input current Idn decreases, and when the first input current Idp decreases, the second input current Idn increases. Additionally, when the first input current Idp reaches a maximum value (i.e., a peak value), the second input current Idn reaches a minimum value (i.e., a bottom value), and when the first input current Idp reaches a bottom value, the second input current Idn reaches a peak value. Preferably, an amplitude of the second input current Idn is equal in magnitude to an amplitude of the first input current Idp and a time average value of the second input current Idn is equal to a time average value of the first input current Idp. As described, the first input current Idp and the second input current Idn are a pair of complementary signals. The receiving circuit 101 is an integrated circuit that includes, for example, the first input terminal 21, the second input terminal 22, the input circuit 30, a differential amplifier 70 and a control circuit 60.

The first input terminal 21 is a terminal that receives the first current signal Idp from the first light receiving element 11 outside of the receiving circuit 101. For example, if the receiving circuit 101 is formed on a semiconductor chip as an integrated circuit, the first input terminal 21 is a pad of the integrated circuit. For example, the first input terminal 21 is electrically connected to the anode of the first light receiving element 11 with a bonding wire. The first current signal Idp is input to the input circuit 30 of the receiving circuit 101 through the first input terminal 21.

The second input terminal 22 is a terminal that receives the second current signal Idn from the second light receiving element 12 outside of the receiving circuit 101. For example, if the receiving circuit 101 is famed on a semiconductor chip as an integrated circuit, the second input terminal 22 is a pad of the integrated circuit. For example, the second input terminal 22 is electrically connected to the anode of the second light receiving element 12 with a bonding wire. The second current signal Idn is input to the input circuit 30 of the receiving circuit 101 through the second input terminal 22.

The input circuit 30 is electrically connected to the first input terminal 21 and the second input terminal 22. The input circuit 30 includes a first node 31 and a second node 32 and outputs a differential current signal (Ip, In) generated based on the first current signal Idp and the second current signal Idn from the first node 31 and the second node 32. A pair of a positive phase current signal Ip (i.e., a positive phase input current Ip) and a reversed phase current signal In (i.e., a reversed phase input current In) is a differential current signal whose phases are reversed with each other, the positive phase current signal Ip is a positive phase component of the differential current signal (Ip, In), and the reversed phase current signal In is a reversed phase component of the differential current signal (Ip, In). The input circuit 30 includes a first inductor 33, a second inductor 34, a first FET 35 and a second FET 36. The first FET 35 is an example of a first variable resistive element and the second FET 36 is an example of a second variable resistive element.

The first inductor 33 is a passive element electrically connected between the first input terminal 21 and the first node 31 and is inserted in series in a signal path that connects the first input terminal 21 to the first node 31. The first inductor 33 is set to have a predetermined inductance. For example, the first inductor 33 is formed by an interconnect on a semiconductor chip. The first inductor 33 may be, for example, a spiral or meander coil, or another type of inductive element.

The second inductor 34 is a passive element electrically connected between the second input terminal 22 and the second node 32 and is inserted in series in a signal path that connects the second input terminal 22 to the second node 32. The second inductor 34 is set to have a predetermined inductance. For example, the second inductor 34 is formed by an interconnect on a semiconductor chip. The second inductor 34 may be, for example, a spiral or meander coil, or another type of inductive element.

The first FET 35 is a field effect transistor that includes a gate 35$g$, a drain 35$d$, and a source 35$s$, and is used to draw the current (i.e., the alternating current) from one side to the other side between the first node 31 and the second input terminal 22. The gate 35$g$ is an example of a first control terminal that receives a control signal Vc, and is connected to the control circuit 60, for example. The drain 35$d$ is an example of a first current terminal electrically connected to the first node 31 and is connected to a signal path between the first inductor 33 and the differential amplifier 70. The source 35$s$ is an example of a second current terminal electrically connected to the second input terminal 22 and is connected to a signal path between the second input terminal 22 and the second inductor 34. Here, the drain 35$d$ and the source 35$s$ may be replaced with each other to connect the drain 35$d$ to the signal path between the second input terminal 22 and the second inductor 34 and connect the source 35$s$ to the signal path between the first inductor 33 and the differential amplifier 70. A resistance value (i.e., the impedance) between the drain 35$d$ and the source 35$s$ changes in accordance with the control signal Vc applied to the gate 35$g$. The control signal Vc applied to the gate 35$g$ is an example of a first control signal. For example, as the voltage value of the control signal Vc increases, the impedance between the drain 35$d$ and the source 35$s$ decreases, and as the voltage value of the control signal Vc decreases, the impedance between the drain 35$d$ and the source 35$s$ increases. The first FET 35 preferably has symmetrical electrical properties with respect to the drain 35$d$ and the source 35$s$. The term "symmetrical" here indicates, for example, that electrical characteristics observed after the drain 35$d$ and the source 35$s$ are replaced are substantially the same as the electrical characteristics observed before the drain 35$d$ and the source 35$s$ are replaced. For example, if the drain current flowing from the drain 35$d$ to the source 35$s$ that is observed after the drain 35$d$ and source 35$s$ are replaced is equal in magnitude to the drain current flowing from the drain 35$d$ to the source 35$s$ that is observed before the drain 35$d$ and source 35$s$ are replaced, the first FET 35 has symmetrical electrical properties. The first FET 35 is an example of the first variable resistive element of which the resistance value is changed in accordance with the first control signal.

The second FET 36 is a field effect transistor that includes a gate 36g, a drain 36d, and a source 36s, and is used to draw the current (i.e., the alternating current) from one side to the other side between the first input terminal 21 and the second node 32. The gate 36g is an example of a second control terminal that receives the control signal Vc and is connected to the control circuit 60, for example. The drain 36d is an example of a third current terminal electrically connected to the first input terminal 21 and is connected to a signal path between the first input terminal 21 and the first inductor 33. The source 36s is an example of a fourth current terminal electrically connected to the second node 32 and is connected to a signal path between the second inductor 34 and the differential amplifier 70. Here, the drain 36d and the source 36s may be replaced with each other to connect the drain 36d to the signal path between the second inductor 34 and the differential amplifier 70 and connect the source 36s to the signal path between the first input terminal 21 and the first inductor 33. A resistance value (i.e., the impedance) between the drain 36d and the source 36s changes in accordance with the control signal Vc applied to the gate 36g. The control signal Vc applied to the gate 36g is an example of a second control signal. For example, as the voltage value of the control signal Vc increases, the impedance between the drain 36d and the source 36s decreases, and as the voltage value of the control signal Vc decreases, the impedance between the drain 36d and the source 36s increases. The second FET 36 preferably has symmetrical electrical properties with respect to the drain 36d and the source 36s. The term "symmetrical" here indicates, for example, that electrical characteristics observed after the drain 36d and the source 36s are replaced is substantially the same as the electrical characteristics observed before the drain 36d and the source 36s are replaced. For example, if the drain current flowing from the drain 36d to the source 36s that is observed after the drain 36d and source 36s are replaced is equal in magnitude to the drain current flowing from the drain 36d to the source 36s that is observed before the drain 36d and source 36s are replaced, the second FET 36 has symmetrical electrical properties. The second FET 36 is an example of the second variable resistive element of which the resistance value is changed in accordance with the second control signal.

The differential amplifier 70 includes a first input node 43 and a second input node 53. The first input node 43 is electrically connected to the first node 31 and the second input node 53 is electrically connected to the second node 32. The differential amplifier 70 is a circuit that generates the differential voltage signal (Vp, Vn) from the differential current signal (Ip, In). The differential amplifier 70 amplifies the difference of the differential current signal (Ip, In) and outputs the differential voltage signal (Vp, Vn) obtained after the differential amplification. The pair of the positive phase output voltage Vp and the reversed phase output voltage Vn are a differential output voltage whose phases are reversed with each other, the positive phase output voltage Vp is a positive phase component of the differential voltage signal (Vp, Vn), and the reversed phase output voltage Vn is a reversed phase component of the differential voltage signal (Vp, Vn). For example, when the positive phase output voltage Vp increases, the reversed phase output voltage Vn decreases, and when the positive phase output voltage Vp decreases, the reversed phase output voltage Vn increases. Additionally, when the positive phase output voltage Vp reaches a maximum value (i.e., a peak value), the reversed phase output voltage Vn reaches a minimum value (i.e., a bottom value), and when the positive phase output voltage Vp reaches a bottom value, the reversed phase output voltage Vn reaches a peak value. Preferably, an amplitude of the reversed phase output voltage Vn is equal in magnitude to an amplitude of the positive phase output voltage Vp and a time average value of the reversed phase output voltage Vn is equal to a time average value of the positive phase output voltage Vp. As described, the positive phase output voltage Vp and the reversed phase output voltage Vn are a pair of complementary signals.

The control circuit 60 detects the amplitude of the differential voltage signal (Vp, Vn) and generates the control signal Vc in accordance with a detected result. The amplitude of the differential voltage signal (Vp, Vn) is determined as an absolute value of the differential voltage Vp-Vn between the positive phase output voltage Vp and the reversed phase output voltage Vn.

The input circuit 30 has a configuration in which the first FET 35 and the second FET 36 are connected in cross connection to the first inductor 33 and the second inductor 34, as illustrated in FIG. 4. One end of the first inductor 33 is electrically connected to the first input terminal 21 and the other end of the first inductor 33 is electrically connected to the first input node 43 in the differential amplifier 70. One end of the second inductor 34 is electrically connected to the second input terminal 22 and the other end of the second inductor 34 is electrically connected to the second input node 53 in the differential amplifier 70. The cross connection indicates that with respect to the paired inputs of the input circuit 30 and the paired outputs of the input circuit 30, one of the paired outputs is connected to the other of the paired inputs through one of the paired interconnects, and the other of the paired outputs is connected to one of the paired inputs through the other of the paired interconnects. With such cross connection, one of the paired interconnects and the other of the paired interconnects are crossed with each other on a circuit diagram. Therefore, by the cross connection, the first FET 35 is connected between the other end of the first inductor 33 and the one end of the second inductor 34, and the second FET 36 is connected between the one end of the first inductor 33 and the other end of the second inductor 34. The input circuit 30 has such a configuration, so that, if the frequency of the first current signal Idp and the second current signal Idn increase, the gain and phase of the input circuit 30 change slowly relative to the frequency. Consequently, the gain band of the input circuit 30 expands to the high frequency side, so that the decrease of the gain band of the receiving circuit 101 can be suppressed, while the group delay of the input circuit 30 approaches zero, so that the degradation of the group delay of the receiving circuit 101 can be suppressed. The reason will be described in detail below.

In the example illustrated in FIG. 4, the differential amplifier 70 includes a first transimpedance amplifier 40 and a second transimpedance amplifier 50.

The first transimpedance amplifier 40 includes a first input node 43. The first transimpedance amplifier 40 is a single-phase (single-end) transimpedance amplifier that converts the positive phase input current Ip that is input to the first input node 43 into the positive phase output voltage Vp. The first transimpedance amplifier 40 includes a first inverting amplifier 41 of an amplification factor A and a first feedback resistor 42 connected between the input and output of the first inverting amplifier 41. For example, as the positive phase input current Ip increases, the positive phase output voltage Vp decreases. When the positive phase input current Ip decreases, the positive phase output voltage Vp increases. The second transimpedance amplifier 50 includes a second input node 53. The second transimpedance amplifier 50 is a single-phase (single-end) transimpedance amplifier that converts the reversed phase input current In that is input to the second input node 53 into the reversed phase output voltage Vn. The second transimpedance amplifier 50 includes a second inverting amplifier 51 of an amplification factor A and a second feedback resistor 52 connected between the input and output of the second inverting amplifier 51. For example, as the reversed phase input current In increases, the reversed phase output voltage Vn decreases. When the reversed phase input current In decreases, the reversed phase output voltage Vn increases. Here, in the receiving circuit 101, the output of the first transimpedance amplifier 40 may be the reversed phase output voltage Vn, and the output of the second transimpedance amplifier 50 may be the positive phase output voltage Vp, so that the positive phase output voltage Vp and the reversed phase output voltage Vn are replaced. In this case, for example, as the positive phase input current Ip increases, the positive phase output voltage Vp increases, and as the positive phase input current Ip decreases, the positive phase output voltage Vp decreases. As the reversed phase input current In increases, the reversed phase output voltage Vn increases, and as the reversed phase input current In decreases, the reversed phase output voltage Vn decreases.

The differential amplifier 70 includes two transimpedance amplifiers that are independent of each other, so that the amplification characteristic in converting the positive phase input current Ip to the positive phase output voltage Vp and the amplification characteristic in converting the reversed phase input current In to the reversed phase output voltage Vn can be separately adjusted. Consequently, for example, if a deviation occurs in one amplification characteristic, the deviation in one amplification characteristic can be corrected without affecting the other amplification characteristic.

The second transimpedance amplifier 50 may have a circuit configuration the same as the circuit configuration of the first transimpedance amplifier 40. For example, the second inverting amplifier 51 may have a circuit configuration the same as the circuit configuration of the first inverting amplifier 41, and the second feedback resistor 52 may have a resistance value equal to the resistance value of the first feedback resistor 42. Here, the same circuit configuration indicates that elements constituting the circuit and connection relations of those elements are the same or equivalent in two or more circuits. In the same circuit configuration, characteristics of the corresponding circuit elements (e.g., constants) are further the same or equivalent, so that the first transimpedance amplifier 40 and the second transimpedance amplifier 50 have the same characteristic (e.g., the amplification characteristic), thereby increasing the effect of suppressing decrease of the gain band and degradation of the group delay. Thus, the electrical characteristics of the second transimpedance amplifier 50 is preferably the same as the electrical characteristics of the first transimpedance amplifier 40. Alternatively, the differential amplifier 70 may be configured so that the electrical characteristics observed after the second transimpedance amplifier 50 is replaced with the first transimpedance amplifier 40 are equivalent to the electrical characteristics observed before the second transimpedance amplifier 50 is replaced with the first transimpedance amplifier 40.

The inductance of the second inductor 34 may be equal to the inductance of the first inductor 33. Here, the equal inductances may, for example, indicate different inductance values within a range of an allowable manufacturing variation, and the equal inductances are not limited to completely identical inductances. This allows each of the first inductor 33 and the second inductor 34 to exhibit the same inductive characteristics, thereby improving the effect of suppressing decrease of the gain band and degradation of the group delay. For example, if the receiving circuit 101 is formed on a semiconductor chip, interconnects on the semiconductor chip can form a spiral or meander coil. For example, the same shape of the coil is used, so that the inductance of the first inductor 33 becomes equal to the inductance of the second inductor 34.

The second FET 36 may have a transistor structure the same as the transistor structure of the first FET 35. Here, the same transistor structure may indicate that the dimensions of the elements constituting the transistor (e.g., the gate length, the gate width, and the like) are, for example, different within a range of an allowable manufacturing variation, and is not limited to have completely identical values. This allows the first FET 35 and the second FET 36 to have the same electrical characteristics (e.g., the same amplification characteristic), thereby improving the effect of suppressing decrease of the gain band and degradation of the group delay. For example, the first FET 35 and the second FET 36 are formed by the same semiconductor process, the respective gate lengths are the same value, and the respective gate widths are the same value, so that the first FET 35 and the second FET 36 can be manufactured to have the same electrical characteristics. The first EET 35 and the second FET 36 are, for example, metal oxide semiconductor field effect transistors (MOSFETs), but are not limited to this type. For example, transistors such as high electron mobility transistors (HEMTs), formed by a compound material such as GaAs that is other than a silicon material, may be used.

In the example illustrated in FIG. 4, a first control signal input to the gate 35g of the first FET 35 and a second control signal input to the gate 36g of the second FET 36 are a common control signal Vc. The control circuit 60 generates, for example, the second control signal to become identical to the first control signal. Here, generating the second control signal to become identical to the first control signal indicates generating the second control signal substantially the same as the first control signal to the extent that can be regarded as being within the assumed error, for example, and is not limited to generating the second control signal that completely matches the first control signal. Here, the control signal Vc may be commonly used for the first control signal and the second control signal. Consequently, signal lines through which the first control signal and the second control signal pass can be shared, and the size of the receiving circuit 101 can be reduced.

The control circuit 60 controls the control signal Vc so that as the amplitude of the differential voltage signal (Vp, Vn) increases, a resistance value between the drain 35d and the source 35s and a resistance value between the drain 36d and the source 36s decrease. The amplitude of the differential voltage signal (Vp, Vn) is, for example, a difference between the peak value of the positive phase output voltage Vp and the bottom value of the reversed phase output voltage Vn (i.e., a peak-to-peak value). The amplitude of the differential voltage signal (Vp, Vn) can be, for example, detected by a peak detection circuit. This reduces the amplitude of the differential current signal (Ip, In) because as the amplitude of the differential voltage signal (Vp, Vn) increases, the current flowing between the drain 35d and the source 35s and the current flowing between the drain 36d and the source 36s increase. The differential current signal (Ip, In) is input to the first input node 43 and the second input node 53 of the differential amplifier 70. As a result, if the first current signal Idp and the second current signal Idn increase, the increase in the differential current signal (Ip, In) is suppressed, so that the saturation of the respective outputs of the first inverting amplifier 41 and the second inverting amplifier 51 in the differential amplifier 70 is suppressed, thereby suppressing distortion of the differential voltage signal (Vp, Vn).

The control circuit 60 increases a voltage value of the control signal Vc so that, for example, as the amplitude of the differential voltage signal (Vp, Vn) increases, the gate voltage applied to the gate 35g and the gate voltage applied to the gate 36g increase. For example, when the voltage of the control signal Vc is lower than the voltage of the drain 35d and the voltage of the source 35s, the first FET 35 is off and no current flows between the drain 35d and the source 35s. At this time, the first current signal Idp is input to the first transimpedance amplifier 40 as the positive phase input current Ip without change. When the voltage of the control signal Vc is higher than the voltage of the drain 35d or the voltage of the source 35s and higher than or equal to a threshold voltage of the first FET 35, the first FET 35 is on and the current flows between the drain 35d and the source 35s. The magnitude of the current flowing between the drain 35d and the source 35s depends on the magnitude of the on-resistance between the drain 35d and the source 35s. As the voltage of the control signal Vc increases, the on-resistance decreases and the current flowing between the drain 35d and the source 35s increases. Here, as described, the bypass current flows between the drain 35d and the source 35s, and thus the on-resistance between the drain 35d and the source 35s is set to be lower than the input impedance of the first input node 43 of the first transimpedance amplifier 40. Additionally, for example, when the voltage of the control signal Vc is lower than the voltage of the drain 36d and the voltage of the source 36s, the second FET 36 is off and no current flows between the drain 36d and the source 36s. At this time, the second current signal Idn is input to the second transimpedance amplifier 50 as the reversed phase input current In without change. When the voltage of the control signal Vc is higher than the voltage of the drain 36d or the voltage of the source 36s and higher than or equal to a threshold voltage of the second FET 36, the second FET 36 is on and the current flows between the drain 36d and the source 36s. The magnitude of the current flowing between the drain 36d and the source 36s depends on the magnitude of the on-resistance between the drain 36d and the source 36s. As the voltage of the control signal Vc increases, the on-resistance decreases and the current flowing between the drain 36d and the source 36s increases. Here, as described, the bypass current flows between the drain 36d and the source 36s, and thus the on-resistance between the drain 36d and the source 36s is set to be lower than the input impedance of the second input node 53 of the second transimpedance amplifier 50. For example, if the electrical characteristics of the first EET 35 are set to be the same as the electrical characteristics of the second FET 36, the magnitude of the current flowing between the drain 35d and the source 35s relative to the control signal Vc becomes equal to the magnitude of the current flowing between the drain 36d and the source 36s. Therefore, if the amplitude of the first current signal Idp is equal to the amplitude of the second current signal Idn, the amplitude of the positive phase input current Ip can be equal to the amplitude of the reversed phase input current In even if the current bypassed by the first FET 35 and the second FET 36 flows. Therefore, the positive phase input current Ip and the reversed phase input current In are equally reduced.

[Detail of a Second Embodiment of the Present Disclosure]

A specific example of a receiving circuit and an optical receiving circuit according to a second embodiment of the present disclosure will be described below with reference to the drawings. The descriptions of the configuration and the effect substantially the same as those of the first embodiment are omitted or simplified by incorporating the above-described description.

Figure 5:
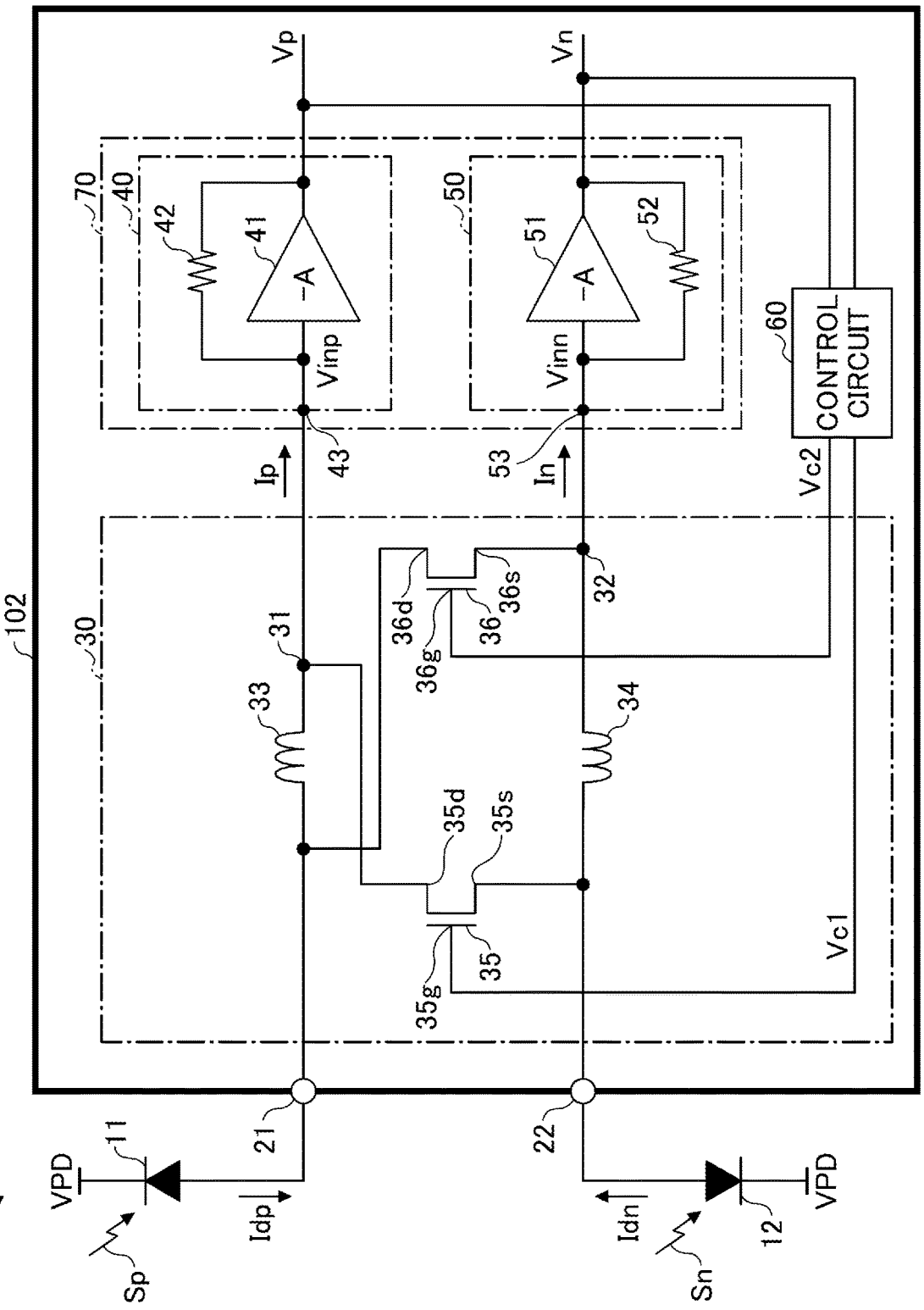
FIG. 5 is a diagram illustrating a configuration example of an optical receiving circuit according to a second embodiment.

FIG. 5 is a diagram illustrating a configuration example of the optical receiving circuit according to the second embodiment. The optical receiving circuit 202 illustrated in FIG. 5 includes the first light receiving element 11, the second light receiving element 12, and a receiving circuit 102. The receiving circuit 102 differs from the receiving circuit 101 (FIG. 4) in that the control circuit 60 generates a first control signal Vc1 and a second control signal Vc2.

The control circuit 60 illustrated in FIG. 5 detects the amplitude of the differential voltage signal (Vp and Vn) and generates the first control signal Vc1 and the second control signal Vc2 in accordance with a detected result. The control circuit 60 controls the first control signal Vc1 so that as the amplitude of the differential voltage signal (Vp, Vn) increases, the current flowing between the drain 35d and the source 35s increases. The control circuit 60 controls the second control signal Vc2 so that as the amplitude of the differential voltage signal (Vp, Vn) increases, the current flowing between the drain 36d and the source 36s increases. Therefore, as in the first embodiment, the increase of the differential current signal (Ip, In) can be suppressed even when the first current signal Idp and the second current signal Idn increase. As a result, the saturation of the first inverting amplifier 41 and the second inverting amplifier 51 in the differential amplifier 70 is suppressed, thereby suppressing distortion of the differential voltage signal (Vp, Vn). Additionally, because the first control signal Vc1 and the second control signal Vc2 can be separately adjusted, for example, even if a difference between the on-resistance of the first FET 35 and the on-resistance of the second FET 36 occurs due to manufacturing variation, distortion of the differential voltage signal (Vp, Vn) can be accurately suppressed by compensating the on-resistance of the first FET 35 and the on-resistance of the second FET 36 to be the same value. Here, the bypass current flows between the drain 35d and the source 35s, and thus the on-resistance between the drain 35d and the source 35s is set to be lower than the input impedance of the first input node 43 of the first transimpedance amplifier 40. Additionally, the bypass current flows between the drain 36d and the source 36s, and thus the on-resistance between the drain 36d and the source 36s is set to be lower than the input impedance of the second input node 53 of the second transimpedance amplifier 50.

[Detail of a Comparative Embodiment]

Next, a comparative embodiment for a comparison with the embodiments of the present disclosure will be described with reference to the drawings.

Figure 1:
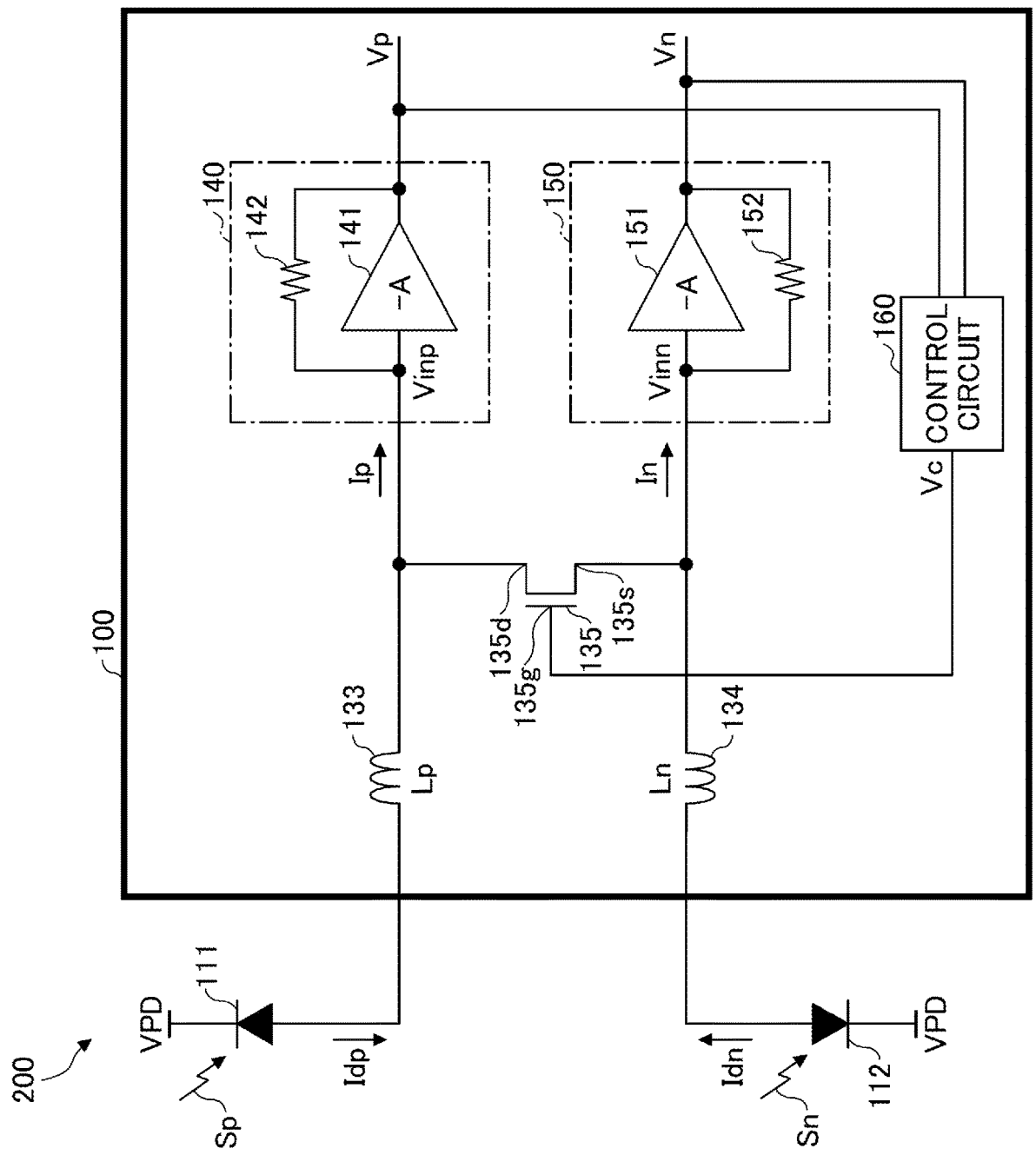
FIG. 1 is a diagram illustrating a configuration example of an optical receiving circuit according to a comparative embodiment.

FIG. 1 is a diagram illustrating a configuration example of an optical receiving circuit according to the comparative embodiment. The optical receiving circuit 200 illustrated in FIG. 1 generates a differential voltage signal (Vp, Vn) from the first optical signal Sp and the second optical signal Sn. A pair of the first optical signal Sp and the second optical signal Sn are the differential optical signal whose phases are reversed from each other, the first optical signal Sp is a positive phase component of the differential optical signal, and the second optical signal Sn is a reversed phase component of the differential optical signal. The optical receiving circuit 200 includes a first light receiving element 111, a second light receiving element 112, and a receiving circuit 100.

The first light receiving element 111 receives the first optical signal Sp and generates the first current signal Idp. The second light receiving element 112 receives the second optical signal Sn and generates the second current signal Idn. The first light receiving element 111 and the second light receiving element 112 are, for example, photodiodes. The electrical and optical characteristics of the first light receiving element 111 are preferably the same as the electrical and optical characteristics of the second light receiving element 112. For example, the first light receiving element 111 may be famed to be the same structure with the same material as the second light receiving element 112. The first current signal Idp and the second current signal Idn constitute the differential input current (Idp, Idn).

The receiving circuit 100 generates the differential voltage signal (Vp, Vn) in response to the first current signal Idp and the second current signal Idn. The first voltage signal Vp and the second voltage signal Vn constitute the differential voltage signal (Vp, Vn). The first voltage signal Vp is a positive phase component of the differential voltage signal (Vp, Vn), and the second voltage signal Vn is a reversed phase component of the differential voltage signal (Vp, Vn). The receiving circuit 100 is electrically connected, for example, to an anode of the first light receiving element 111. The receiving circuit 100 is electrically connected, for example, to an anode of the second light receiving element 112. More specifically, the receiving circuit 100 includes a pair of input terminals (differential input terminals), one of the input terminals is electrically connected to the anode of the first light receiving element 111 and the other of the input terminals is electrically connected to the anode of the second light receiving element 112. Therefore, the differential input current (Idp, Idn) is input to the differential input terminals. The receiving circuit 100 converts the differential input signal (Idp, Idn) into the differential voltage signal (Vp, Vn). The receiving circuit 100 includes a first inductor 133, a first transimpedance amplifier 140, a second inductor 134, a second transimpedance amplifier 150, an FET 135, and a control circuit 160.

The first inductor 133 is electrically connected between the first light receiving element 111 and the first transimpedance amplifier 140. The first transimpedance amplifier 140 converts the positive phase input current Ip that is input to the first transimpedance amplifier 140 itself into a positive phase output voltage Vp. The first transimpedance amplifier 140 includes a first inverting amplifier 141 of an amplification factor A and a first feedback resistor 142 connected between the input and output of the first inverting amplifier 141.

The second inductor 134 is electrically connected between the second light receiving element 112 and the second transimpedance amplifier 150. The second transimpedance amplifier 150 converts the reversed phase input current In that is input to the second transimpedance amplifier 150 itself into the reversed phase output voltage Vn. The second transimpedance amplifier 150 includes a second inverting amplifier 151 of an amplification factor A and a second feedback resistor 152 connected between the input and output of the second inverting amplifier 151.

The FET 135 is a field effect transistor including a gate 135g, a drain 135d, and a source 135s. The gate 135g is a control terminal that receives the control signal Vc. The drain 135d is a current terminal connected to a signal path connecting the first inductor 133 to the first transimpedance amplifier 140. The source 135s is a current terminal connected to a signal path connecting the second inductor 134 to the second transimpedance amplifier 150. The impedance between the drain 135d and the source 135s changes in accordance with the control signal Vc applied to the gate 135g. For example, as the voltage value of the control signal Vc increases, the impedance between the drain 135d and the source 135s decreases, and as the voltage value of the control signal Vc decreases, the impedance between the drain 135d and the source 135s increases. The FET 135 preferably has symmetrical electrical properties with respect to the drain 135d and the source 135s. The term "symmetrical" here indicates, for example, that the electrical characteristics observed after the drain 135d and the source 135s are replaced are substantially the same as the electrical characteristics observed before the drain 135d and the source 135s are replaced. For example, if the drain current flowing from the drain 135d to the source 135s observed after the drain 135d and the source 135s are replaced is equal in magnitude to the drain current flowing from the drain 135d to the source 135s before the drain 135d and source 135s are replaced, the FET 135 has the symmetrical electrical characteristics. If the FET 135 is symmetric, the drain 135d may be connected to the signal path connecting the second inductor 134 and the second transimpedance amplifier 150, and the source 135s may be connected to the signal path connecting the first inductor 133 and the first transimpedance amplifier 140.

The control circuit 160 detects the amplitude of the differential voltage signal (Vp, Vn) and generates the control signal Vc based on a detected result. The amplitude of the differential voltage signal (Vp, Vn) is determined as the absolute value of the difference voltage Vp-Vn between the first voltage signal Vp and the second voltage signal Vn. The control circuit 160 controls the control signal Vc so that as the amplitude of the differential voltage signal (Vp, Vn) increases, the current flowing between the drain 135d and the source 135s increases. The control circuit 160 may control the control signal Vc so that the current flows between the drain 135d and the source 135s if the amplitude of the differential voltage signal (Vp, Vn) is greater than a predetermined value.

Figure 2:
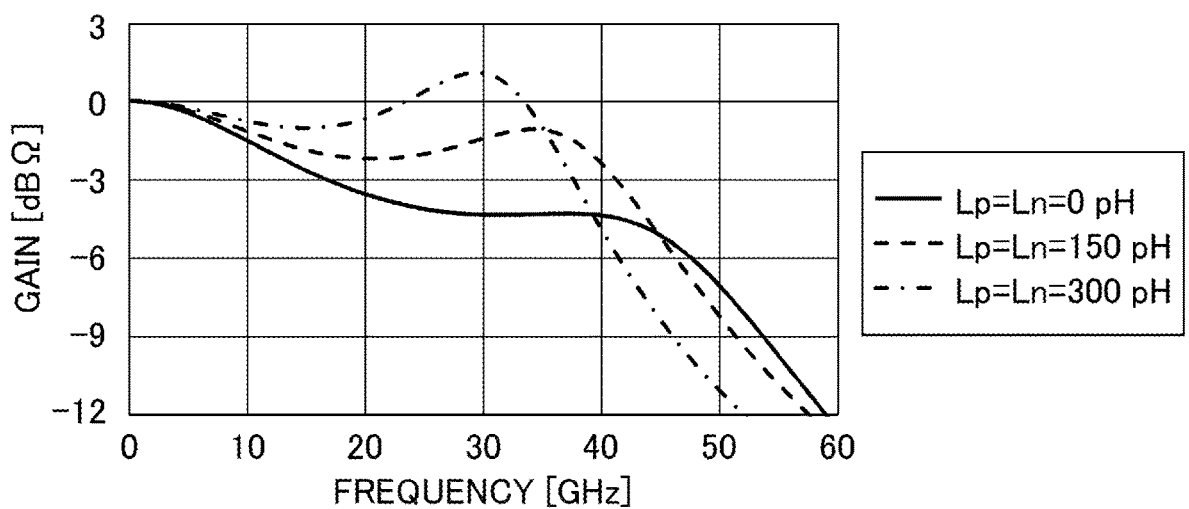
FIG. 2 is a graph illustrating an example of frequency characteristics of a gain of the optical receiving circuit according to the comparative embodiment.

FIG. 2 is a graph illustrating frequency characteristics of a gain of the light receiving circuit according to the comparative embodiment. FIG. 2 illustrates the frequency characteristics of the gain (i.e., the differential gain) due to a change in the inductance of the first inductor 133 and the second inductor 134 in the receiving circuit 100 illustrated in FIG. 1. The inductance of the first inductor 133 is Lp and the inductance of the second inductor 134 is Ln. In FIG. 2, the frequency on the horizontal axis represents the frequencies of the first current signal Idp and the second current signal Idn, and the gain on the vertical axis represents the differential gain G (=(Vinp−Vinn)/(Idp−Idn)). The unit of the differential gain G is in Ω (ohm) and the differential gain G is expressed by the impedance. The vertical axis of FIG. 2 indicates the differential gain G(f) obtained when the frequency is f [Hz] that is expressed in decibels by 20×log ((G(f)/G(0)), relative to the differential gain G(0) obtained when the frequency is 0 [Hz]. The unit of the differential gain G in decibels is conveniently expressed in dBΩ. Vinp represents a positive phase input voltage that is input to the first transimpedance amplifier 140, and Vinn represents a reversed phase input voltage that is input to the second transimpedance amplifier 150. The positive phase input voltage Vinp and the reversed phase input voltage Vinn constitute a differential input voltage (Vinp, Vinn). FIG. 2 illustrates the frequency characteristic of the differential gain G observed when the FET 135 is off.

As illustrated in FIG. 2, the first inductor 133 and the second inductor 134 have a peaking characteristic in the frequency characteristic of the gain and have the effect of increasing the peak value of the gain, before the gain decreases as the frequency increases. As the inductance Lp and the inductance Ln increase, the peak value of the gain increases and a decrease in the gain at the high frequency can be suppressed.

Figure 3:
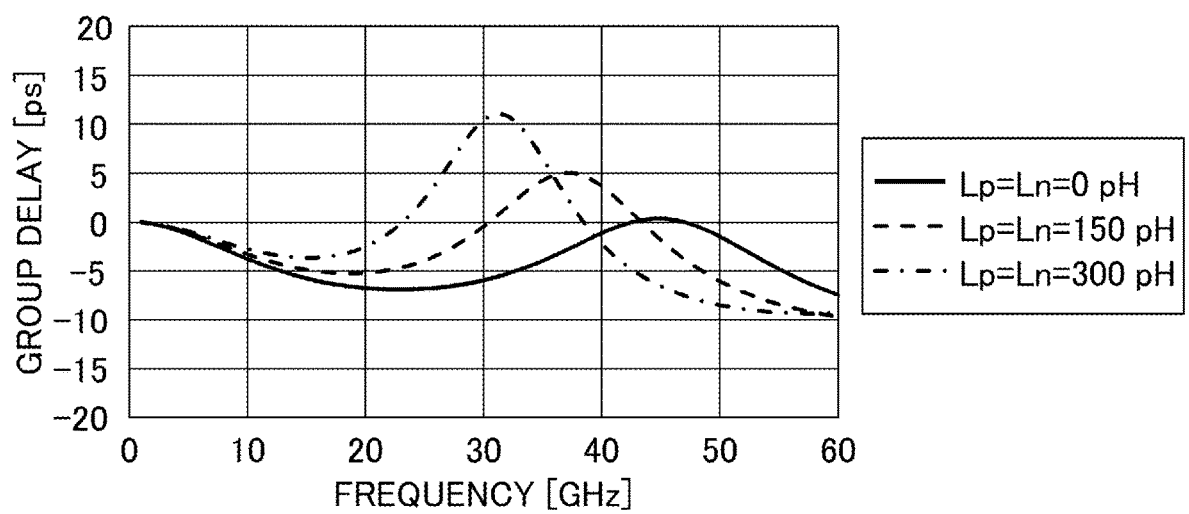
FIG. 3 is a graph illustrating an example of frequency characteristics of a group delay of the optical receiving circuit according to the comparative embodiment.

However, as illustrated in FIG. 3, as the inductance Lp and the inductance Ln increase, the peak value of the group delay increases in the frequency characteristic of the group delay. FIG. 3 is a graph illustrating the frequency characteristics of the group delay of the optical receiving circuit according to the comparative embodiment. The group delay of FIG. 3 indicates the group delay of the differential input voltage (Vinp, Vinn) relative to the differential input current (Idp, Idn). The group delay is obtained by differentiating a difference in phase between the differential input current (Idp, Idn) and the differential input voltage (Vinp, Vinn) with respect to an angular frequency ω(=2Πf). The group delay is preferably as close to zero as possible. FIG. 3 illustrates the frequency characteristic of the group delay observed when the FET 135 is off.

As described, in the comparative embodiment illustrated in FIG. 1, there is a trade-off relation between the frequency characteristic of the gain and the frequency characteristic of the group delay. That is, increasing the gain band degrades the group delay, and suppressing degradation of the group delay decreases the gain band. The embodiments of the present disclosure have a function to improve such a trade-off relation.

[Comparison of Effects of the Comparative Embodiment and the First Embodiment]

Figure 6:
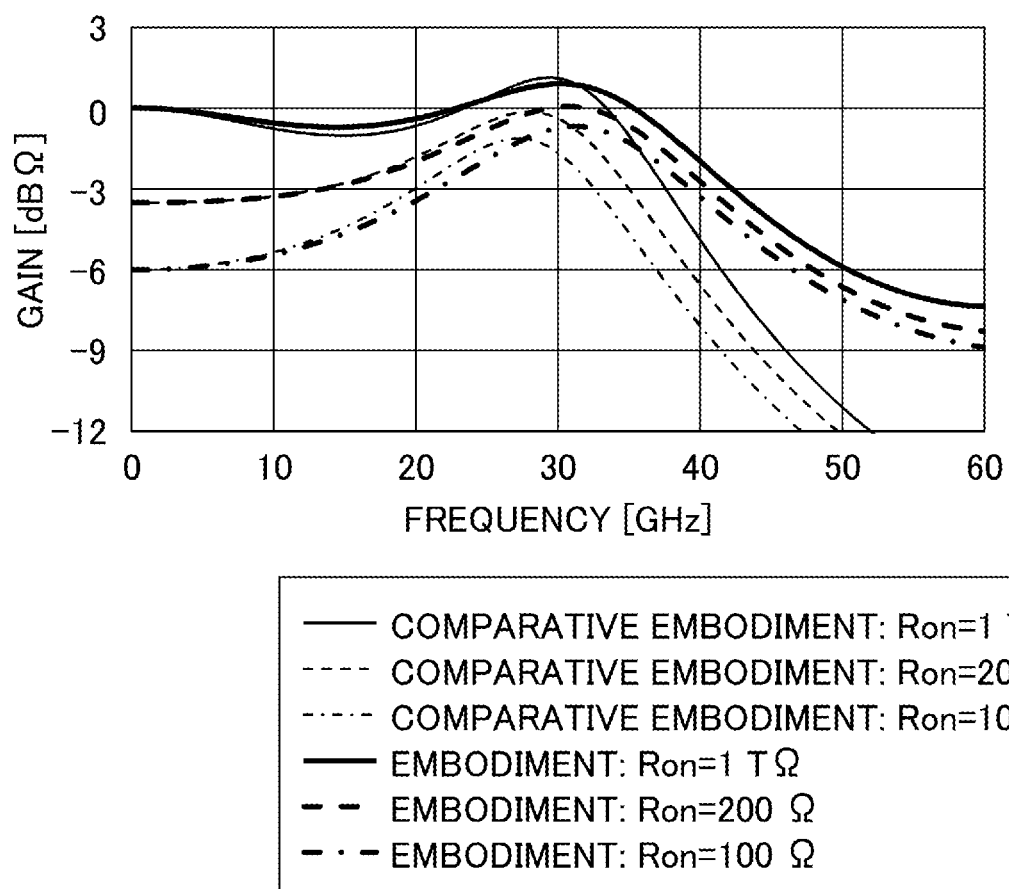
FIG. 6 is a graph illustrating an example of the frequency characteristics of the gain of the optical receiving circuit according to the comparative embodiment and the optical receiving circuit according to the first embodiment.
Figure 7:
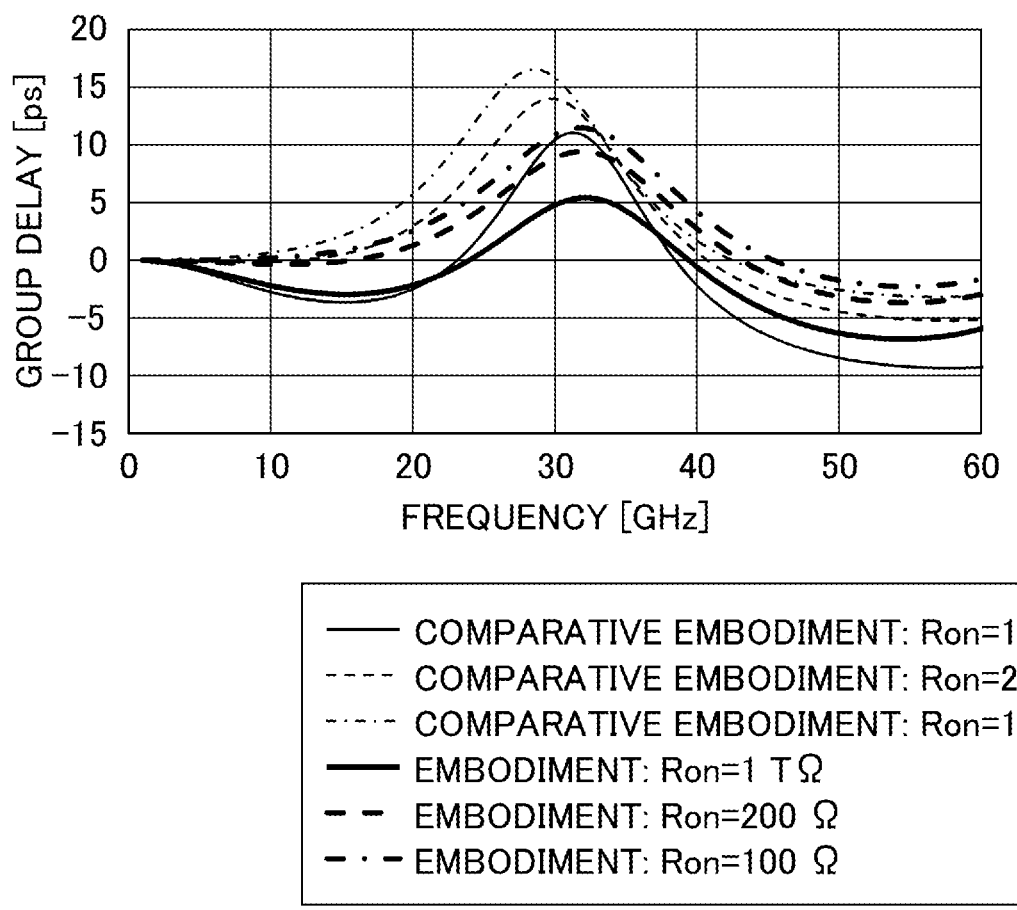
FIG. 7 is a graph illustrating an example of the frequency characteristics of the group delay of the optical receiving circuit according to the comparative embodiment and the optical receiving circuit according to the first embodiment.

FIG. 6 is a graph illustrating an example of the frequency characteristics of the gain of the light receiving circuit according to the comparative embodiment and the light receiving circuit according to the first embodiment. FIG. 7 is a graph illustrating an example of the frequency characteristics of the group delay of the light receiving circuit according to the comparative embodiment and the light receiving circuit according to the first embodiment. Ron of the comparative embodiment in the legends of FIG. 6 and FIG. 7 represents a resistance value between the drain 135$d$ and the source 135$s$ of the FET 135 in the receiving circuit 100 illustrated in FIG. 1. Ron of the embodiment in the legends of FIG. 6 and FIG. 7 represents a combined resistance value of the resistance value between the drain 35$d$ and the source 35$s$ of the first FET 35 and the resistance value between the drain 36$d$ and the source 36$s$ of the second FET 36 in the receiving circuit 101 illustrated in FIG. 4. The combined resistance value is determined as the resistance value of the parallel connection in which the drain 35$d$ of the first FET 35 is connected to the drain 36$d$ of the second FET 36 and the source 35$s$ of the first FET 35 is connected to the source 36$s$ of the second FET 36. Resistance values of 1 TΩ, 100Ω, and 200Ω are values obtained by assuming a state in which the FET is OFF, a state in which the FET is ON, and an intermediate state between a state in which the FET is OFF and a state in which the FET is ON.

In FIG. 6 and FIG. 7, the frequency on the horizontal axis represents the frequencies of the first current signal Idp and the second current signal Idn. In FIG. 6, the gain on the vertical axis represents the differential gain (=(Vinp−Vinn)/(Idp−Idn)). The gain on the vertical axis of FIG. 6 is represented in decibels as in FIG. 2. In FIG. 7, the group delay on the vertical axis represents the group delay from the pair of light receiving elements to the pair of transimpedance amplifiers.

As illustrated in FIG. 6, the gain band expands on the high frequency side in the first embodiment because a decrease in the gain in the high frequency band is suppressed in comparison with the comparative embodiment. Further, as illustrated in FIG. 7, when comparing the first embodiment with the comparative embodiment at the same resistance value, in the first embodiment, the peak value of the group delay approaches zero and the degradation of the group delay is suppressed in comparison with the comparative embodiment. As described, according to the data shown in FIG. 6 and FIG. 7, the first embodiment improves the trade-off relation between the gain characteristic and the group delay characteristic in comparison with the comparative embodiment. Similarly, the second embodiment also improves the trade-off relation.

Figure 8:
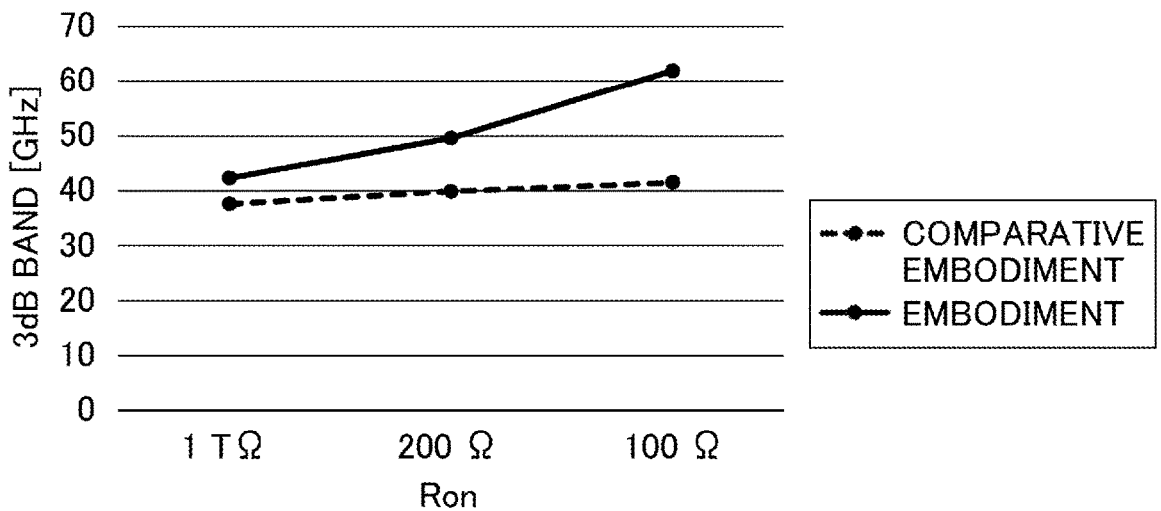
FIG. 8 is a diagram illustrating an example of characteristics of a 3 dB band of the optical receiving circuit according to the comparative embodiment and a 3 dB band of the optical receiving circuit according to the first embodiment.

FIG. 8 is a diagram illustrating the 3 dB band characteristics of the light receiving circuit according to the comparative embodiment and the light receiving circuit according to the first embodiment. The vertical axis of FIG. 8 represents the frequency at which the gain decreases by 3 dB relative to the value at 1 GHz in the frequency characteristic of the gain illustrated in FIG. 6. That is, in FIG. 6, with respect to the frequency where a horizontal axis at −3 dB and each of the curves intersect, the highest frequency is considered to be the 3 dB band for that curve. As illustrated in FIG. 8, in the first embodiment, it is found the gain band is broadened because the frequency (3 dB band) at which the gain decreases by 3 dB from the value at 1 GHz increases in comparison with the comparative embodiment. In particular, as the resistance value decreases, the gain band greatly increases.

Figure 9:
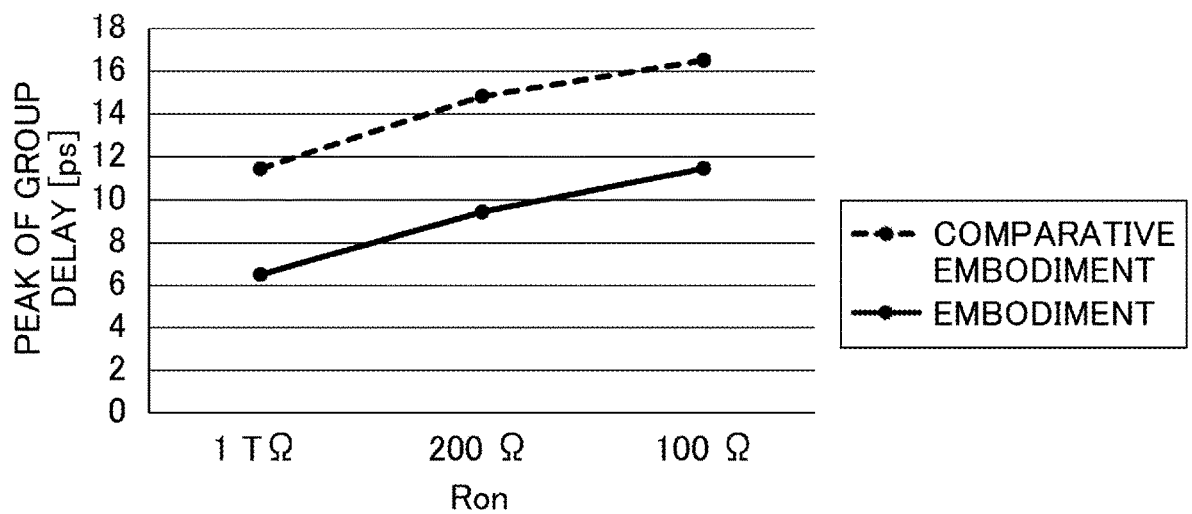
FIG. 9 is a graph illustrating an example of characteristics of a peak of the group delay of the optical receiving circuit according to the comparative embodiment and a peak of the group delay of the optical receiving circuit according to the first embodiment.

FIG. 9 is a diagram illustrating an example of the peak characteristic of the group delay of the light receiving circuit according to the comparative embodiment and the light receiving circuit according to the first embodiment. The vertical axis of FIG. 9 represents the peak value of the group delay in the group delay characteristic illustrated in FIG. 7. As illustrated in FIG. 9, in the first embodiment, it is found that group delay degradation is suppressed because, regardless of the off state or the on state of the first FET 35 and the second FET 36, the peak value of the group delay is reduced in both of the states in comparison with the comparative embodiment.

As described, according to the data shown in FIG. 8 and FIG. 9, the first embodiment improves the trade-off relation between the gain characteristic and the group delay characteristic in comparison with the comparative embodiment. Similarly, the second embodiment also improves the trade-off relationship.

[About a Transfer Function and a Frequency Response]

Figure 10:
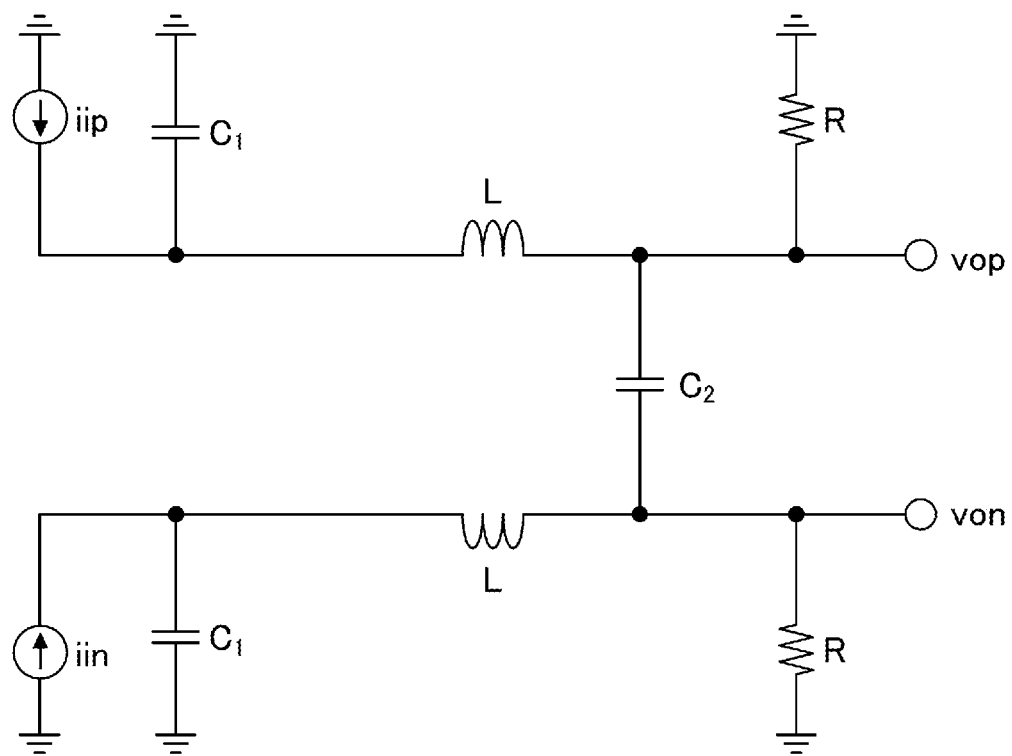
FIG. 10 is a diagram illustrating an example of an equivalent circuit of the optical receiving circuit according to the comparative embodiment.

FIG. 10 is a diagram illustrating an example of an equivalent circuit of the light receiving circuit according to the comparative embodiment, and specifically, an equivalent circuit of the input circuit from the first light receiving element 111 and the second light receiving element 112 to the first transimpedance amplifier 140 and the second transimpedance amplifier 150. FIG. 10 indicates that the FET 135 is off. The parasitic capacitance from the first light receiving element 111 to the first inductor 133 and the parasitic capacitance from the second light receiving element 112 to the second inductor 134 are $C_1$, and the inductance of the first inductor 133 and the second inductor 134 is L. The parasitic capacitance $C_1$ is, for example, a ground capacitance contained by an interconnect between the first light receiving element 111 and the first inductor 133 or a ground capacitance contained by an interconnect between the second light receiving element 112 and the second inductor 134. The capacitance between the drain 135d and the source 135s in the FET 135 is $C_2$, and the input impedance of the first transimpedance amplifier 140 and the second transimpedance amplifier 150 is R.

Figure 11:
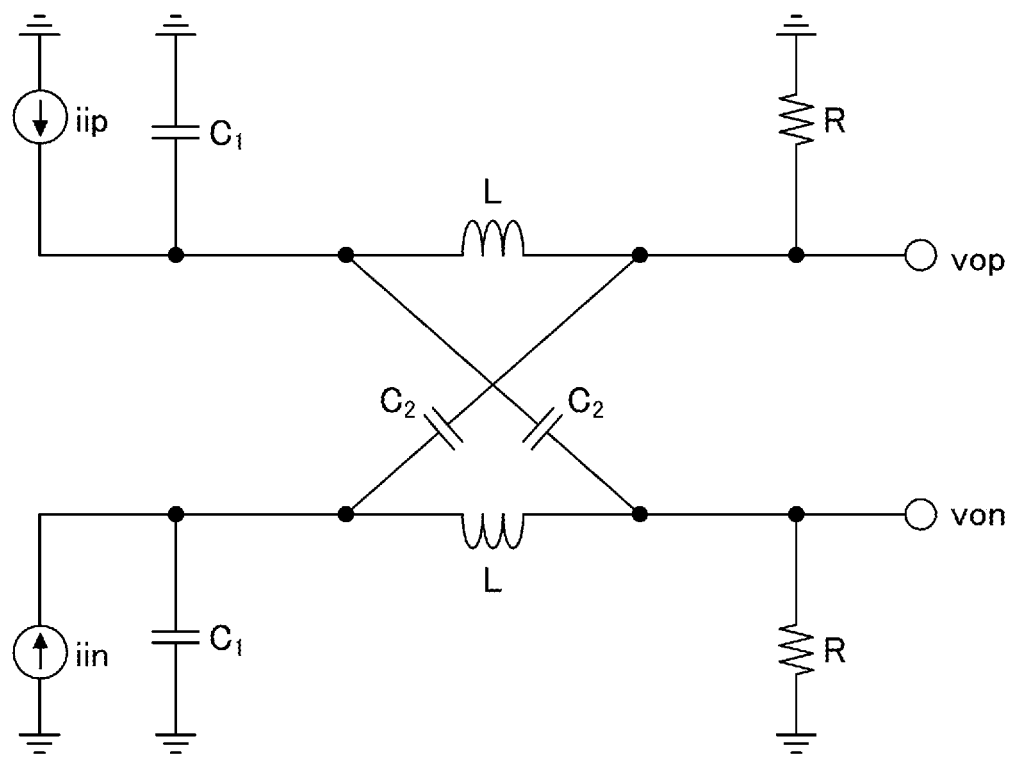
FIG. 11 is a diagram illustrating an example of an equivalent circuit of the optical receiving circuit according to the first embodiment.

FIG. 11 is a diagram illustrating an equivalent circuit of the light receiving circuit according to the first embodiment, and specifically, an equivalent circuit of the input circuit 30 from the first light receiving element 11 and the second light receiving element 12 to the first transimpedance amplifier 40 and the second transimpedance amplifier 50. FIG. 11 indicates that the first FET 35 and the second FET 36 are off. The parasitic capacitance from the first light receiving element 11 to the first inductor 33 and the parasitic capacitance from the second light receiving element 12 to the second inductor 34 are $C_1$, and the inductance of the first inductor 33 and the second inductor 34 is L. The capacitance between the drain 35d and the source 35s in the first FET 35 and the capacitance between the drain 36d and the source 36s in the second FET 36 is $C_2$, and the input resistance impedance of the first transimpedance amplifier 40 and the second transimpedance amplifier 50 is R. The equivalent circuit of FIG. 10 and the equivalent circuit of FIG. 11 differ in that the first inductor 133 and the second inductor 134 are connected through one capacitance $C_2$ while the first inductor 33 and the second inductor 34 are connected in cross connection through two capacitances $C_2$.

In the two equivalent circuits illustrated in FIG. 10 and FIG. 11, a case of a differential drive in which the second current signal Idn has a reversed phase with respect to the first current signal Idp (iin=−iip) is assumed. Here, iin represents the current value of the second current signal Idn, iip represents the current value of the first current signal Idp, vop represents the positive phase input voltage of the first transimpedance amplifier, and von represents the reversed phase input voltage of the second transimpedance amplifier. In this case, a transfer function equation and a frequency response equation from iip to vop can be represented as (1a) and (1b), and (2a) and (2b), respectively. Here, s is the Laplace operator, and ω is the angular frequency.

[Equation 1]

$$Z_1(s) = \frac{R}{2RLC_1C_2s^3 + LC_1s^2 + R(C_1 + 2C_2)s + 1} \quad (1a)$$

$$Z_1(j\omega) = \frac{R}{1 - \omega^2 LC_1 + j\omega R(C_1 + 2C_2 - 2\omega^2 LC_1C_2)} \quad (1b)$$

[Equation 2]

$$Z_2(s) = R\frac{-LC_2s^2 + 1}{RLC_1C_2s^3 + L(C_1 + C_2)s^2 + R(C_1 + 4C_2)s + 1} \quad (2a)$$

$$Z_2(j\omega) = R\frac{1 + \omega^2 C_2 L}{1 - \omega^2 L(C_1 + C_2) + j\omega R(C_1 + 4C_2 - \omega^2 LC_1C_2)} \quad (2b)$$

(1a) represents a transfer function equation $Z_1(s)$ of the equivalent circuit of FIG. 10, and (1b) represents a frequency response equation $Z_1(j\omega)$ of the equivalent circuit of FIG. 10. (2a) represents a transfer function equation $Z_2(s)$ of the equivalent circuit of FIGS. 11, and (2b) represents a frequency response equation $Z_2(j\omega)$ of the equivalent circuit of FIG. 11. While (1b) has the angular frequency terms ($\omega^2$, $\omega$, $\omega^3$) only in the denominator, (2b) has the angular frequency term ($\omega^2$) not only in the denominator but also in the numerator. Therefore, if the frequencies of the first current signal Idp and the second current signal Idn become high, the embodiment slows the change in the gain and phase of the input circuit 30 with respect to the angular frequency in comparison with the comparative embodiment. Consequently, a decrease of the gain band of the receiving circuit can be suppressed because the gain band of the input circuit 30 expands on the high frequency side, while degradation of the group delay of the receiving circuit can be suppressed because the group delay of the input circuit 30 approaches zero.

Figure 12:
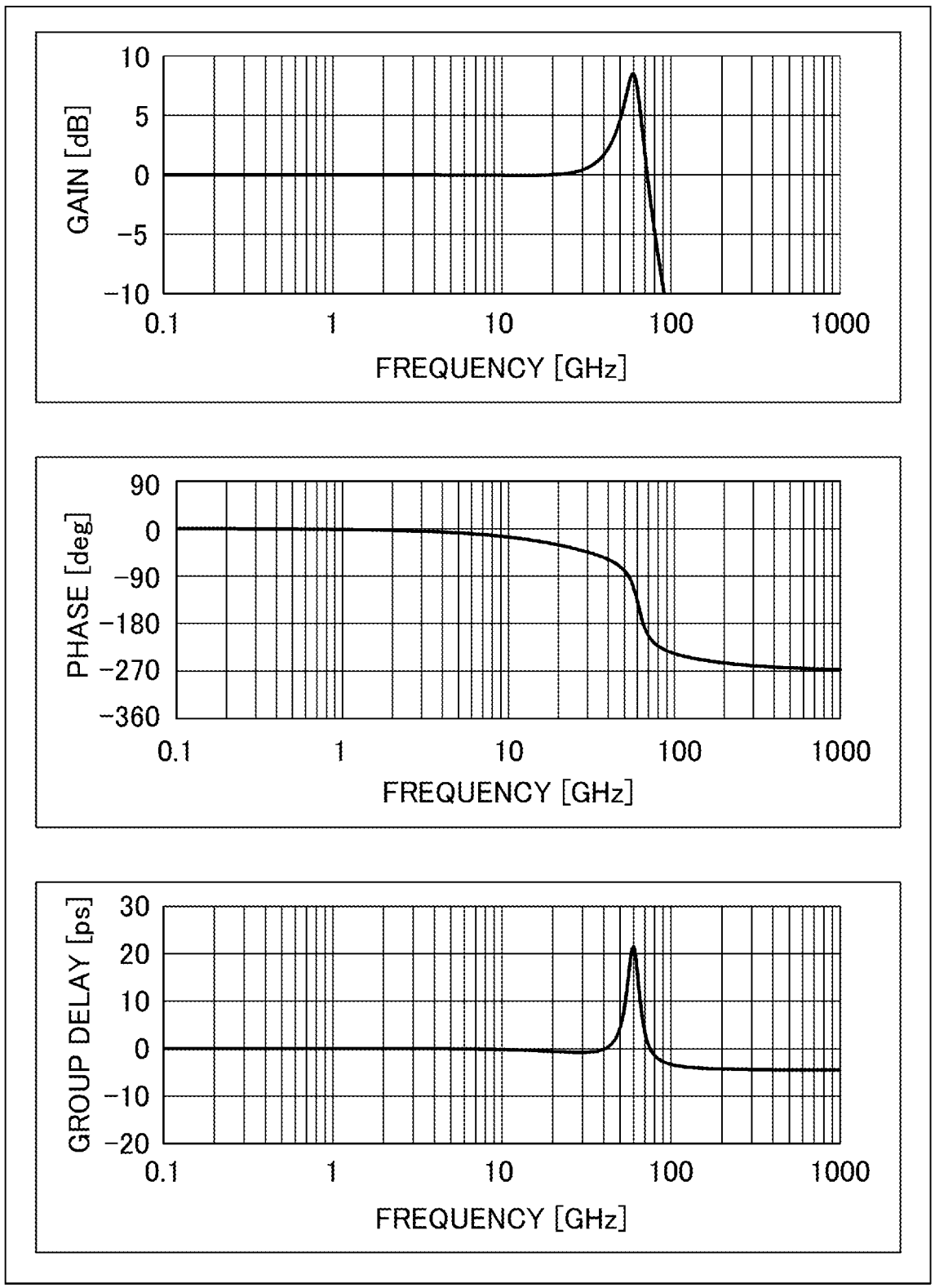
FIG. 12 is of graphs illustrating examples of frequency characteristics of the optical receiving circuit according to the comparative embodiment.
Figure 13:
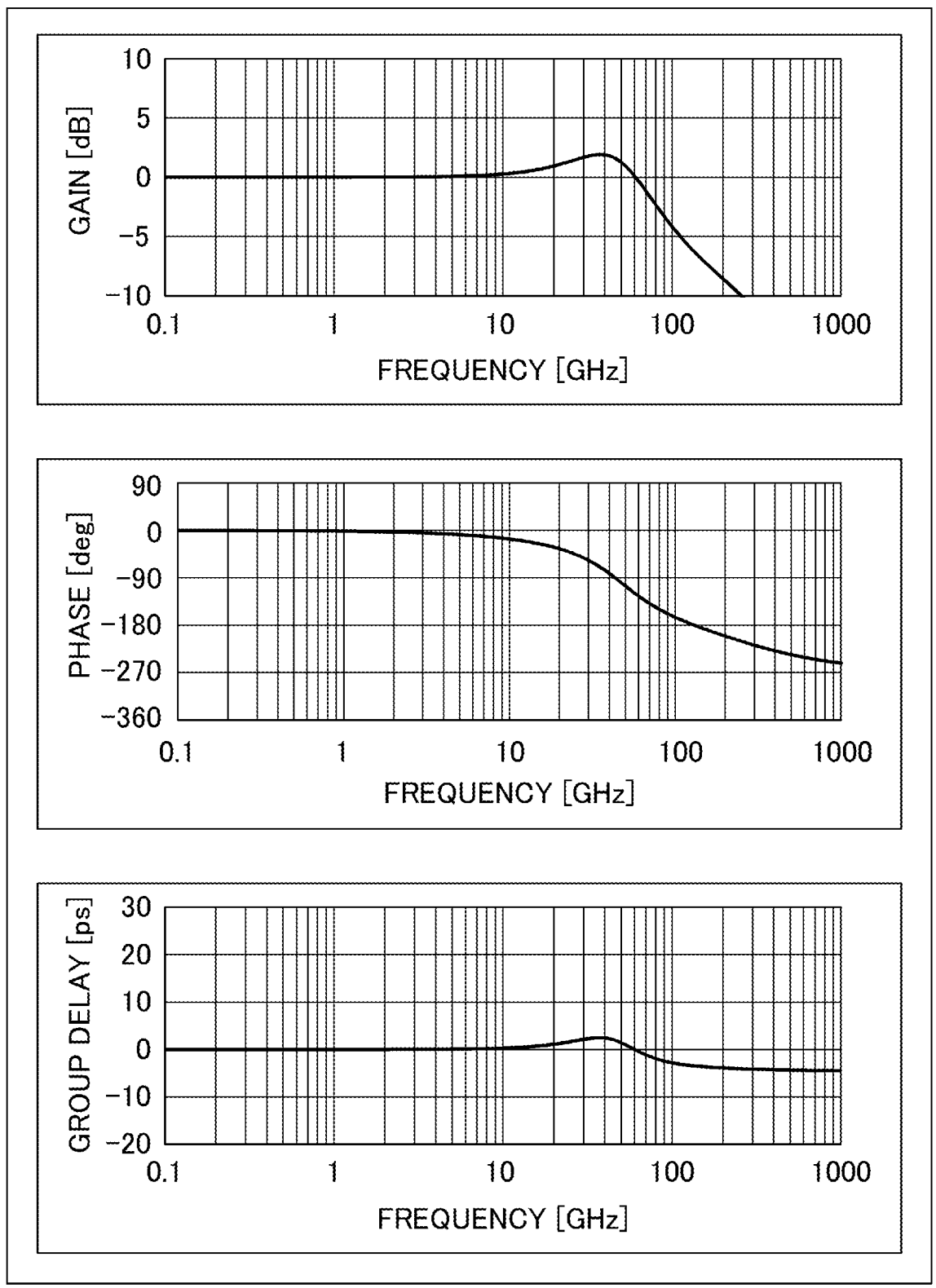
FIG. 13 is of graphs illustrating examples of frequency characteristics of the optical receiving circuit according to the first embodiment.

FIG. 12 is of graphs illustrating an example of the frequency characteristics of the light receiving circuit according to the comparative embodiment. FIG. 12 illustrates the frequency characteristics of the gain, the phase, and the group delay in the equation (1b) above with L=300 pH, $C_1$=30 fF, $C_2$=30 fF, and R=50 Ω). FIG. 13 is of graphs illustrating an example of the frequency characteristics of the light receiving circuit according to the first embodiment. FIG. 13 illustrates the frequency characteristics of the gain, the phase, and the group delay in the equation (2b) above with $C_2$=15 fF, assuming that the FET 135 of the comparative embodiment is split into two and connected in cross connection to the first inductor 33 and the second inductor 34. Here, the other constants are the same as the constants used in FIG. 12. In FIG. 12 and FIG. 13, the group delay corresponds to a value obtained by differentiating the phase with respect to the angular frequency ω.

In FIG. 13, the gain and phase slowly change in a range to the high frequency band in comparison with FIG. 12. Therefore, a decrease in the gain in the high frequency band is suppressed, so that the gain band can be broadened and variation of the group delay can be suppressed.

Although the embodiments have been described above, it will be understood that various modifications of the form and the detail can be made without departing from the spirit and scope of the claims. Various alterations and modifications, such as a combination and a substitution with part or the entire of another embodiment can be made.

What is claimed is:

1. A receiving circuit comprising:
a first input terminal and a second input terminal;
an input circuit that includes a first node, a second node, a first inductor, a second inductor, a first variable resistive element, and a second variable resistive element, the first inductor being electrically connected between the first input terminal and the first node, the second inductor being electrically connected between the second input terminal and the second node, the first variable resistive element being electrically connected between the first node and the second input terminal, and the second variable resistive element being electrically connected between the second node and the first input terminal,
a differential amplifier configured to generate a differential voltage signal in accordance with a differential current signal, the differential amplifier including a first input node and a second input node, the first input node being electrically connected to the first node, the second input node being electrically connected to the second node, and the differential current signal being input to the first input node and the second input node, and a control circuit configured to perform detection of an amplitude of the differential voltage signal and change a resistance value of the first variable resistive element and a resistance value of the second variable resistive element based on a result of the detection.

2. The receiving circuit as claimed in claim 1, wherein the differential amplifier includes a first transimpedance amplifier configured to generate a positive phase component of the differential voltage signal from a positive phase component of the differential current signal and a second transimpedance amplifier configured to generate a reversed phase component of the differential voltage signal from a reversed phase component of the differential current signal, the first transimpedance amplifier being electrically connected to the first input node, and the second transimpedance amplifier being electrically connected to the second input node.

3. The receiving circuit as claimed in claim 2, wherein the second transimpedance amplifier has a circuit configuration identical to a circuit configuration of the first transimpedance amplifier.

4. The receiving circuit as claimed in claim 1, wherein the second inductor has an inductance equal to an inductance of the first inductor.

5. The receiving circuit as claimed in claim 1, wherein the second variable resistive element has an electrical characteristic identical to an electrical characteristic of the first variable resistive element.

6. The receiving circuit as claimed in claim 1,
wherein the resistance value of the first variable resistive element changes in accordance with a first control signal;
wherein the resistance value of the second variable resistive element changes in accordance with a second control signal; and
wherein the control circuit generates the second control signal that is identical to the first control signal.

7. The receiving circuit as claimed in claim 1,
wherein the resistance value of the first variable resistive element changes in accordance with a first control signal;
wherein the resistance value of the second variable resistive element changes in accordance with a second control signal; and
wherein the control circuit controls the first control signal and the second control signal so that as the amplitude of the differential voltage signal increases, the resistance value of the first variable resistive element and the resistance value of the second variable resistive element decrease.

8. An optical receiving circuit for generating a differential voltage signal from a first optical signal and a second optical signal, the optical receiving circuit comprising:
a first light receiving element configured to generate a first current signal in accordance with the first optical signal;
a second light receiving element configured to generate a second current signal in accordance with the second optical signal;
a first input terminal electrically connected to the first light receiving element;
a second input terminal electrically connected to the second light receiving element;
an input circuit that includes a first node, a second node, a first inductor, a second inductor, a first variable resistive element, and a second variable resistive element, the first inductor being electrically connected between the first input terminal and the first node, the second inductor being electrically connected between the second input terminal and the second node, the first variable resistive element being electrically connected between the first node and the second input terminal, and the second variable resistive element being electrically connected between the second node and the first input terminal,
a differential amplifier configured to generate a differential voltage signal in accordance with a differential current signal, the differential amplifier including a first input node and a second input node, the first input node being electrically connected to the first node, the second input node being electrically connected to the second node, and the differential current signal being input to the first input node and the second input node, and
a control circuit configured to perform detection of an amplitude of the differential voltage signal and change a resistance value of the first variable resistive element and a resistance value of the second variable resistive element based on a result of the detection.

* * * * *